US012682954B2

(12) United States Patent
Huang et al.

(10) Patent No.: US 12,682,954 B2
(45) Date of Patent: Jul. 14, 2026

(54) PRECHARGING METHOD AND PROGRAMMING METHOD FOR SELECTED AND UNSELECTED SUB-BLOCKS OF 3D MEMORY STRINGS IN A DEVICE

(71) Applicant: MACRONIX International Co., Ltd., Hsinchu (TW)

(72) Inventors: Yu-Hung Huang, Tainan City (TW); Ya-Jui Lee, Taichung City (TW); Che-Ping Chen, Taipei City (TW); Yin-Jen Chen, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 195 days.

(21) Appl. No.: 18/658,997

(22) Filed: May 9, 2024

(65) Prior Publication Data

US 2025/0349359 A1      Nov. 13, 2025

(51) Int. Cl.
| | |
|---|---|
| *G11C 16/04* | (2006.01) |
| *G11C 7/10* | (2006.01) |
| *G11C 8/08* | (2006.01) |
| *G11C 11/408* | (2006.01) |
| *G11C 16/08* | (2006.01) |
| *G11C 16/10* | (2006.01) |

(Continued)

(52) U.S. Cl.
CPC ........ *G11C 16/0483* (2013.01); *G11C 7/1048* (2013.01); *G11C 8/08* (2013.01); *G11C 11/4085* (2013.01); *G11C 16/08* (2013.01); *G11C 16/102* (2013.01); *G11C 16/28* (2013.01); *G11C 16/3427* (2013.01)

(58) Field of Classification Search
CPC ..... G11C 16/0483; G11C 7/1048; G11C 8/08; G11C 11/4085; G11C 16/08; G11C 16/102; G11C 16/28; G11C 16/3427; G11C 16/10
See application file for complete search history.

(56) References Cited

U.S. PATENT DOCUMENTS

| | | | |
|---|---|---|---|
| 2010/0054036 | A1 | 3/2010 | Lee et al. |
| 2018/0046574 | A1 | 2/2018 | Yoon et al. |

(Continued)

FOREIGN PATENT DOCUMENTS

| | | |
|---|---|---|
| TW | 202242880 | 11/2022 |

OTHER PUBLICATIONS

"Office Action of Taiwan Counterpart Application", issued on Apr. 9, 2025, p. 1-p. 3.

*Primary Examiner* — Donald HB Braswell
(74) *Attorney, Agent, or Firm* — J.C. PATENTS

(57) ABSTRACT

Provided are a precharging method and a programming method for a 3D memory device that includes a top-deck word line group, a middle dummy word line group, a bottom-deck word line group, and a bottom dummy word line group. The precharging method includes: selecting a word line to be programmed; determining whether the word line is in the top- or bottom-deck word line group; applying a precharge on voltage to the middle dummy word line group to turn on a channel to precharge the channel when the word line is in the top-deck word line group; and applying a precharge off voltage to the middle dummy word line group to turn off the channel to not precharge the channel when the word line is in the bottom-deck word line group. This method is suitable for a 3D NAND flash memory having high capacity and high performance.

15 Claims, 8 Drawing Sheets

(51) Int. Cl.
  G11C 16/28 (2006.01)
  G11C 16/34 (2006.01)

(56) References Cited

U.S. PATENT DOCUMENTS

2023/0326536 A1 * 10/2023 Song ...................... G11C 16/24
                                                  365/185.02
2024/0055055 A1    2/2024 Cho et al.
2024/0055059 A1 *  2/2024 Guo  ................... G11C 16/3427
2024/0145006 A1 *  5/2024 Zhang ...................... G11C 7/14

* cited by examiner

PRECHARGING METHOD AND PROGRAMMING METHOD FOR SELECTED AND UNSELECTED SUB-BLOCKS OF 3D MEMORY STRINGS IN A DEVICE

BACKGROUND

Technical Field

The disclosure relates to an operating method for a memory device, and in particular relates to a precharging method for a 3D memory device.

Description of Related Art

Generally, a precharging operation is performed before programming a memory, that is, before applying a programming pulse. Precharge is the key factor to mitigating programming disturbance. Insufficient precharge capability may worsen programming disturbance and raise the high bound of the memory cell erase state, which results in a loss of read space (window).

Nowadays, in order to achieve high capacity, 3D NAND memory devices have more stacked layers and adopt multi-deck structures. The simplified structure shown in FIG. 1 includes, from top to bottom, a top-deck word line group (WL) 2, a middle dummy word line group (MDWL) 6, a bottom-deck word line group (WL) 4, and a bottom dummy word line group (BDWL) 8. The precharge voltage is generally applied from the common source line (CSL) on the source side to further exclude electrons in the channel 9. During the precharging operation, the bottom dummy word lines (BDWL) 8 and the middle dummy word lines (MDWL) 6 are turned on so as to completely apply the precharge voltage to the channel 9.

That is, when performing the precharging operation, a voltage needs to be applied to the selected middle dummy word line group (MDWL) 6 at the joint layer to turn on the middle dummy word line group (MDWL) 6, thereby applying the precharge voltage from the common source line (CSL) side to the channel 9. For this reason, the threshold voltage of the selected middle dummy word line group (MDWL) 6 at the joint layer has an impact on the precharge capability.

According to the related art, in the process of programming all the word lines for the middle dummy word line group (MDWL) 6 at the joint layer, the middle dummy word line group (MDWL) 6 continues to be turned on and off when the bottom-deck word lines (WL) 4 are programmed even though the programming for the top-deck word lines 2 has been completed. At this time, due to the down-coupling A effect, the redundant precharge generated by turning on and off the middle dummy word line group (MDWL) 6 leads to disturbance on the boundary word lines 2a adjacent to the middle dummy word line group (MDWL) 6. That is, because the channel potential Pch increases, electrons move to the memory cells on the adjacent boundary word lines 2a. This increases the high bound of the memory cell erase (ER) state.

Therefore, it is particularly important to maintain the precharge capability of the top-deck word lines and avoid causing disturbance to the word lines adjacent to the middle dummy word lines.

SUMMARY

As described above, according to an embodiment of the disclosure, a precharging method for a 3D memory device is provided. The 3D memory device at least includes: a top-deck word line group, a middle dummy word line group, a bottom-deck word line group, and a bottom dummy word line group arranged in sequence. The precharging method includes: selecting a word line from the top-deck word line group and the bottom-deck word line group to be programmed; determining whether the word line selected is in the top-deck word line group or the bottom-deck word line group; applying a precharge on voltage to the middle dummy word line group so that a precharge voltage reaches a channel at a position corresponding to the middle dummy word line group in response to the word line being in the top-deck word line group; and applying a precharge off voltage to the middle dummy word line group so that the precharge voltage does not reach the channel at a position corresponding to the middle dummy word line group in response to the word line being in the bottom-deck word line group.

According to another embodiment of the disclosure, a precharging method for a 3D memory device is provided. The 3D memory device at least includes: multiple decks of word line groups, a plurality of middle dummy word line groups, and a bottom dummy word line group, in which the bottom dummy word line group is located below a lower-most deck of word line group of the multiple decks of word line groups, and each of the plurality of middle dummy word line groups is arranged between every two decks of word line groups of the multiple decks of word line groups. The precharging method includes: selecting a word line from the multiple decks of word line groups to be programmed; determining in which one deck of word line group of the multiple decks of word line groups the word line is located in; applying a precharge on voltage to each middle dummy word line group below the one deck of word line group so that a precharge voltage reaches a channel at a position corresponding to each middle dummy word line group below the one deck of word line group; and applying a precharge off voltage to each middle dummy word line group above the one deck of word line group so that the precharge voltage does not reach the channel at a position corresponding to each middle dummy word line group above the one deck of word line group.

According to another embodiment of the disclosure, a programming method for a 3D memory device is provided. The 3D memory device at least includes: a top-deck word line group, a middle dummy word line group, a bottom-deck word line group, and a bottom dummy word line group arranged in sequence. The programming method includes: selecting a word line from the top-deck word line group and the bottom-deck word line group to be programmed; determining whether the word line selected is in the top-deck word line group or the bottom-deck word line group; applying a precharge on voltage to the middle dummy word line group so that a precharge voltage reaches a channel at a position corresponding to the middle dummy word line group in response to the word line being in the top-deck word line group; applying a precharge off voltage to the middle dummy word line group so that the precharge voltage does not reach the channel at a position corresponding to the middle dummy word line group in response to the word line being in the bottom-deck word line group; and applying a programming voltage to the word line selected after completing applying the precharge voltage.

According to an embodiment of the disclosure, in the above-mentioned precharging method or programming method, the 3D memory device further includes a common source line, and the precharge voltage is applied from the common source line.

According to an embodiment of the disclosure, in the above-mentioned precharging method or programming method, the precharge on voltage is much smaller than a voltage for programming the word line selected, and the precharge off voltage is OV.

According to an embodiment of the disclosure, the above-mentioned precharging method or programming method further includes applying the precharge on voltage to the bottom dummy word line group when precharging.

According to an embodiment of the disclosure, in the above-mentioned precharging method or programming method, the 3D memory device includes an array including a plurality of memory cells, and the plurality of memory cells are single-level cells, multiple-level cells, triple-level cells, or quad-level cells. According to an embodiment of the disclosure, in the above-mentioned precharging method or programming method, the 3D memory device is a 3D NAND memory device.

Based on the embodiments of the disclosure, in a 3D memory device with a structure that has multiple decks of word line groups, the middle dummy word line layer is appropriately controlled to be turned on or off in the precharge stage based on the position of the word line selected to be programmed, so as to control the precharging operation. Thus, the precharge capability of the top-deck word lines can be maintained and disturbance to the word lines adjacent to the middle dummy word lines can be prevented.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Hereinafter, a 3D NAND flash memory will be described as an example. However, the disclosure is not limited thereto and can be applied to any memory with a 3D structure. The disclosure can also be applied to a 2D memory.

Figure 1:
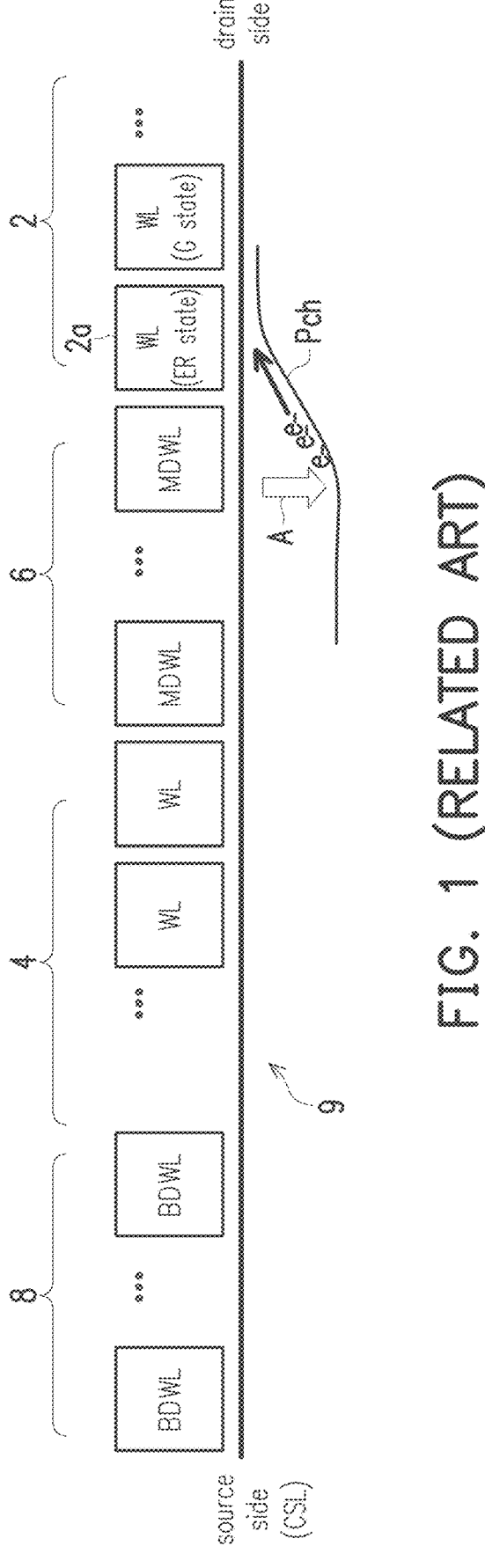
FIG. 1 is an explanatory diagram illustrating how precharge affects programming disturbance.
Figure 2:
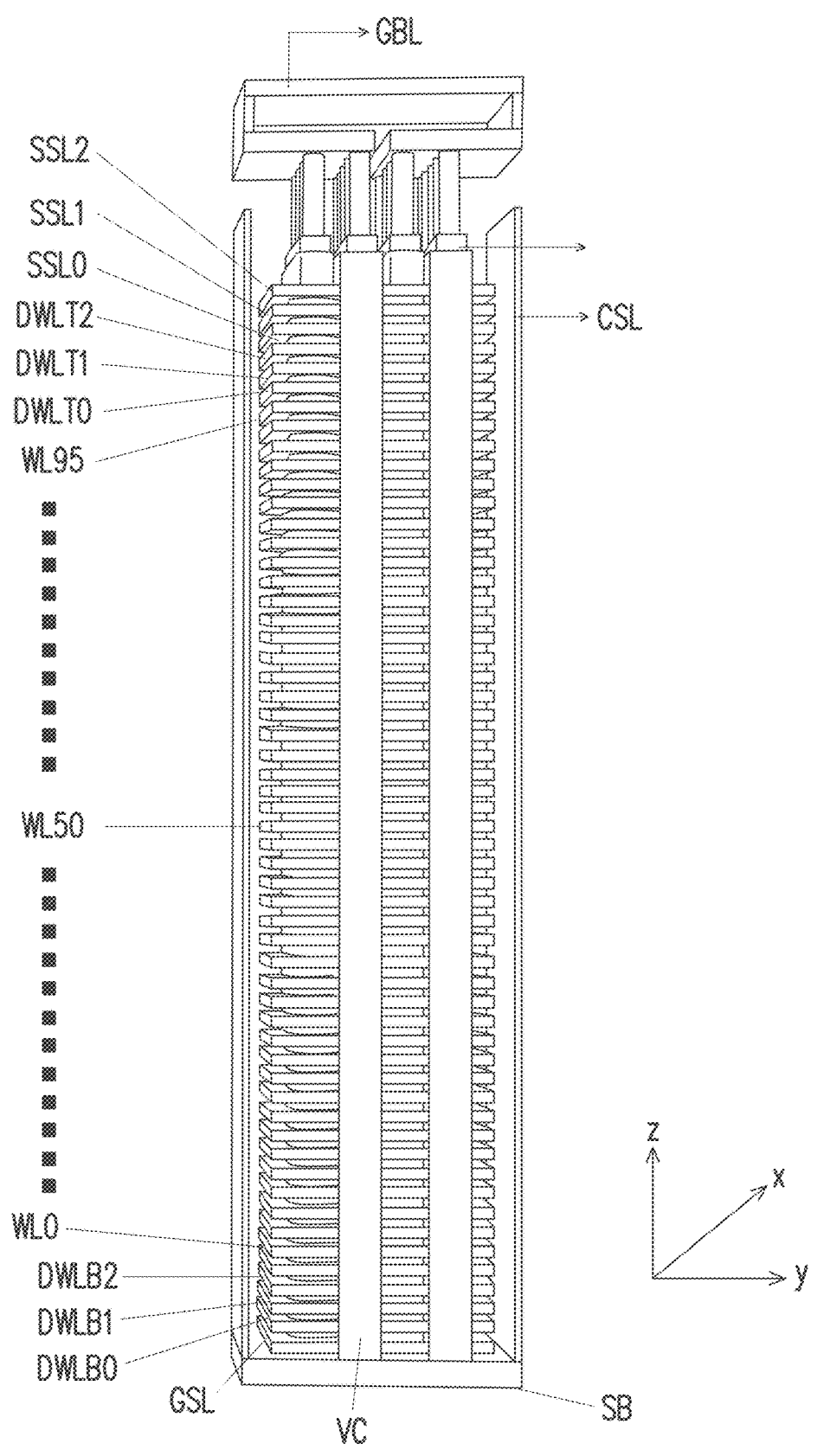
FIG. 2 is a schematic diagram of the memory structure associated with the word lines.

FIG. 2 illustrates a memory architecture as an application example of an embodiment of the disclosure, which illustrates a partial structure of a 3D NAND flash memory. In addition, the embodiment of the disclosure illustrates a multi-deck structure, while FIG. 2 only illustrates one deck. Therefore, a 3D NAND flash memory with a double-deck structure has two of the structures shown in FIG. 1. That is to say, above the dummy word lines DWLT0 to DWLT2, the structure of the top-deck word lines is further arranged between the selection line SSL0 and the dummy word lines DWLT0 to DWLT2. In other words, a structure equivalent to the word lines WL0 to WL95 is further stacked to form a double-deck 3D NAND flash memory. Each layer of the dummy word lines DWLT0 to DWLT2 between the multiple word lines in the top deck and the bottom deck can also be called a joint layer. Additionally, more word lines may be stacked in the same manner to form a structure of three or more decks.

The following is a brief description of a single-deck structure. As illustrated by the structure shown in FIG. 2, a 3D NAND flash memory device includes a plurality of word lines WL0 to WL95 (96 word lines, for example) formed in the vertical direction z, and a vertical channel VC is also formed along the vertical direction z. Each word line extends on the xy plane. Further, bottom dummy word lines DWLB1 and DWLB0 are arranged below the word line WL0, and top dummy word lines DWLT1 and DWLT0 are arranged above the word line WL95.

Although two bottom dummy word lines and two top dummy word lines are shown here, the number of the bottom and top dummy word lines is not particularly limited and may be adjusted appropriately as required.

In addition, the 3D NAND flash memory device also includes a common source line (CSL), which connects the source lines together. The 3D NAND flash memory device further includes selection lines SSL0, SSL1, SSL2, and so on, which may be arranged above the top dummy word line DWLT1. The 3D NAND flash memory device also has a global source line (GSL) below the bottom dummy word lines, and a global bit line (GBL) above the top dummy word lines to connect each bit line. Nevertheless, the structure of the 3D NAND flash memory device shown in FIG. 2 is illustrated to facilitate understanding the relationship between one deck of word lines (data word lines) WL0 to WL95 and the dummy word lines, and is not intended to limit the implementation of the disclosure.

Figure 3:
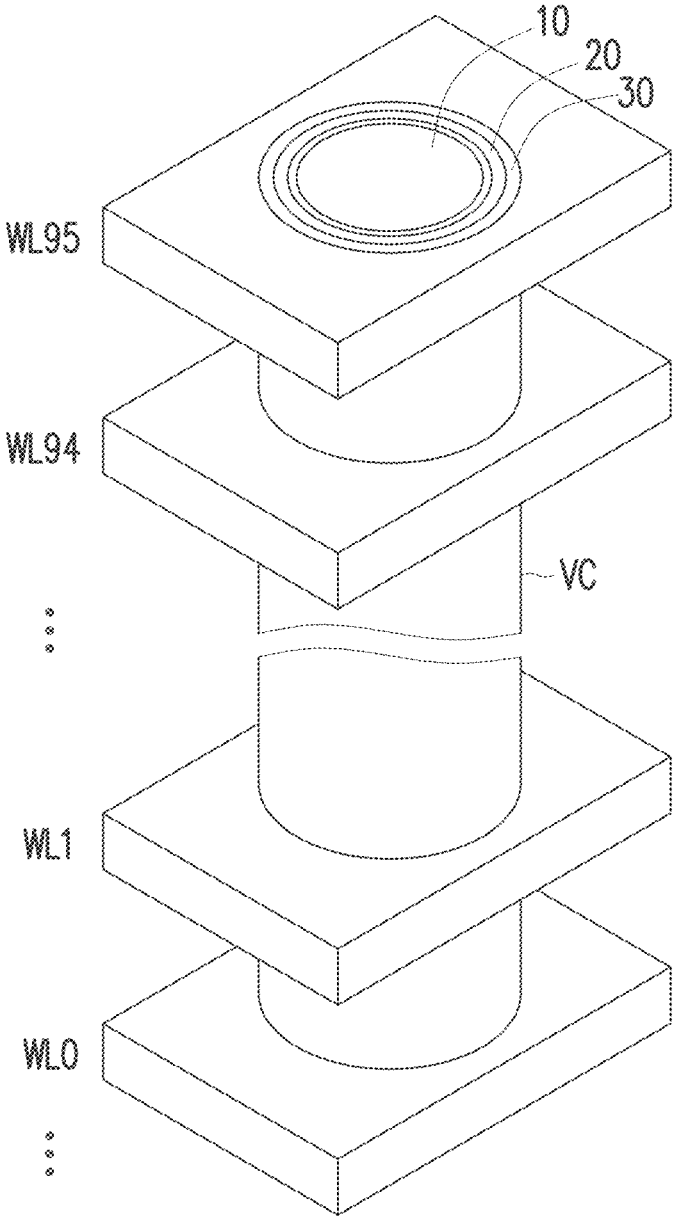
FIG. 3 is a schematic diagram of the structure of the word lines.

FIG. 3 is a schematic diagram showing the structure of each word line, which is an enlarged view of some of the word lines in FIG. 2. As shown in FIG. 3, the 3D NAND flash memory device includes a plurality of word lines WL0 to WL95, which are penetrated by the vertical channel VC. The vertical channel VC includes a dielectric layer core 10, a channel layer 20 surrounding the dielectric layer core 10, and a charge trapping layer 30 between the word lines WL0 to WL95 and the channel layer 20. The channel layer 20 is formed of, for example, polycrystalline silicon, and the charge trapping layer is formed of, for example, an oxide-nitride-oxide (ONO) layer. The structure illustrated here is only an example of the 3D NAND flash memory device to which the programming method of the disclosure can be applied, and the method of the disclosure is not necessarily applied to certain types of memory structures.

Figure 4:
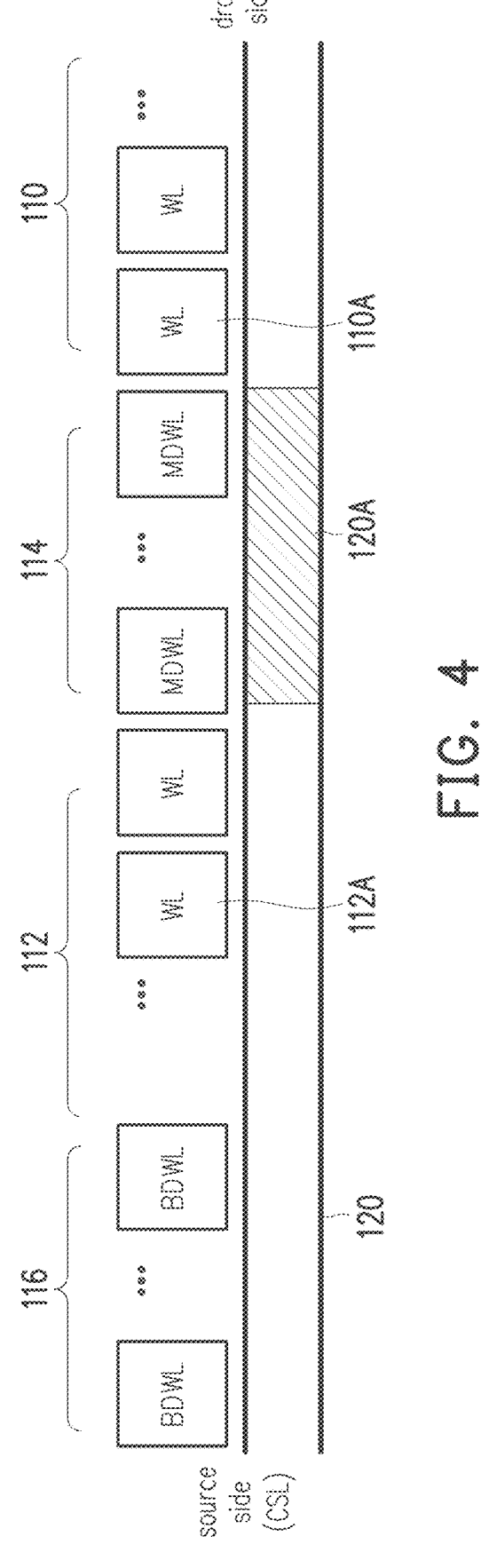
FIG. 4 is a schematic diagram of an application scenario according to an embodiment of the disclosure.

FIG. 4 is a schematic diagram of an application scenario according to an embodiment of the disclosure. As shown in FIG. 4, a 3D memory device 100 at least includes a top-deck word line group 110, a middle dummy word line group 114, a bottom-deck word line group 112, and a bottom dummy word line group 116 arranged in sequence. Each word line group may include multiple word lines. In this example, the drain side is above the 3D memory device 100 and the source side is below the 3D memory device 100. In addition, the 3D memory device 100 is only illustrated with the essential configuration, which schematically shows the positional relationship between the word lines and a channel 120. Other components of the 3D memory device 100 that are not shown here may be inferred from existing structures developed for the future, and thus detailed description will be omitted.

In addition, in this example, the 3D memory device 100 is a double-deck stacked 3D NAND flash memory device, which is formed by stacking two of the structures shown in FIG. 2 and FIG. 3. Moreover, the memory device is programmed by, for example, programming each word line WL one by one from the top-deck word line group 110 to the bottom-deck word line group 112. In addition, when programming, the so-called Increment Step Programming Pulse (ISPP) method can be used to program the selected word lines.

Figure 5A:
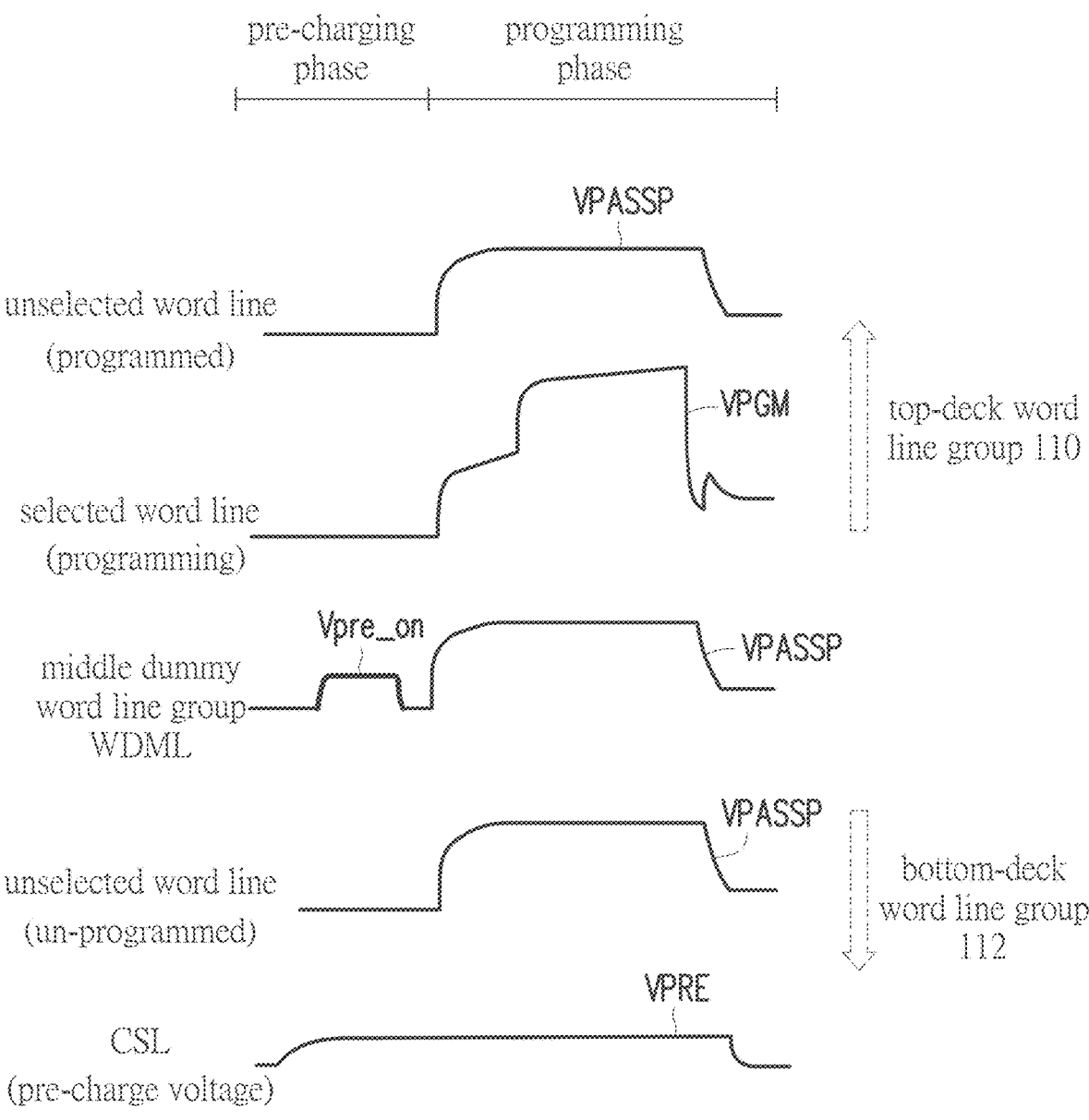
FIG. 5A and FIG. 5B are schematic waveform diagrams of a precharging method according to an embodiment of the disclosure.
Figure 5B:
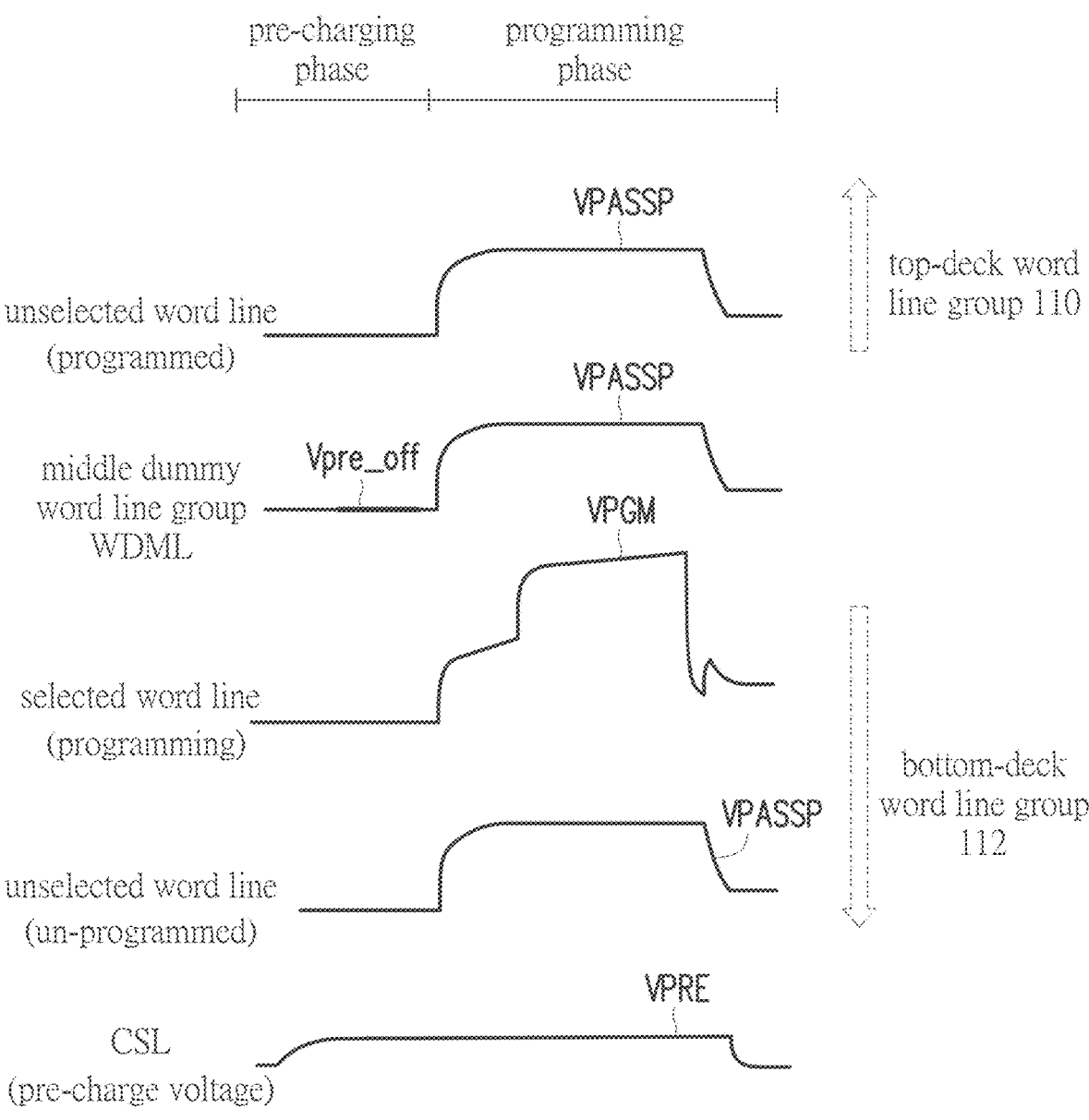

FIG. 5A and FIG. 5B are schematic waveform diagrams of a precharging method according to an embodiment of the disclosure. According to the embodiment of the disclosure, the on and off of the middle dummy word line group 114 during the precharge period is controlled in order to reduce the disturbance caused by the precharging operation to the boundary word lines (such as 110A) adjacent to the middle dummy word line group 114.

As shown in FIG. 4 and FIG. 5A, when programming each word line WL, each word line WL is sequentially programmed from the top-deck word line group 110 to the bottom-deck word line group 112. FIG. 5A only illustrates representative word lines, and does not illustrate all word lines WL. Before programming, a precharge voltage VPRE is applied from the common source line CSL to be input to the channel (vertical channel) 120.

First, a word line to be programmed is selected sequentially from the top-deck word line group 110 and the bottom-deck word line group 112. Then, it is determined whether the word line is in the top-deck word line group 110 or the bottom-deck word line group 112. For example, when the selected word line 110A is in the top-deck word line group 110, in the precharge stage, a precharge on voltage Vpre_on is applied to the middle dummy word line group (MDWL) 114 to turn on the corresponding channel 120A. In addition, in order to perform precharge, the bottom dummy word line group (BDWL) 116 is also turned on by applying the precharge on voltage Vpre_on. Further, because each memory cell on the bottom-deck word line group 112 has not been programmed and is in the erase (ER) state, the corresponding channel is also on. Therefore, by turning on the middle dummy word line group (MDWL) 114, the precharge voltage VPRE applied from the common source line CSL can reach the channel 120A corresponding to the middle dummy word line group (MDWL) 114. Thus, for example, before programming the selected word line 110A in the top-deck word line group 110, the dummy word line group (MDWL) 114 is turned on to perform precharge. Thus, the corresponding channel from the bottom dummy word line to the dummy word line group (MDWL) 114 can be sufficiently boosted by the precharge voltage VPRE to further exclude the electrons remaining in the channel to reduce programming disturbance. In addition, the precharge capability of the top-deck word line group 110 can also be maintained.

Furthermore, it suffices if the precharge on voltage Vpre_on can turn on the memory cells coupled to the middle dummy word line group (MDWL) 114 to turn on the channel 120A. In addition, the voltage value of the precharge on voltage Vpre_on may be much smaller than the programming voltage VPGM to avoid an erroneous operation of the middle dummy word line group (MDWL) 114.

Moreover, as shown in FIG. 5A, after the precharge stage is completed, the programming stage starts. At this time, the programming voltage VPGM is applied to the selected word line 110A to perform programming, and the pass voltage VPASSP is applied to the unselected word lines (including the programmed word lines in the top-deck word line group 110 and the unprogrammed word lines in the bottom-deck word line group 112). In addition, the pass voltage VPASSP is also applied to the middle dummy word line group (MDWL) 114 and even the bottom dummy word line group (BDWL) 116. The pass voltage VPASSP can keep the word line in an unselected state.

Furthermore, as shown in FIG. 5B, when the selected word line 112A is in the bottom-deck word line group 112, in the precharge stage, a precharge off voltage Vpre_off is applied to the middle dummy word line group (MDWL) 114 to turn off the channel 120A. In addition, in order to perform precharge, the bottom dummy word line group (BDWL) 116 is also turned on by applying the precharge on voltage Vpre_on. Further, in the bottom-deck word line group 112, the memory cells connected to the word lines below the selected word line 112A have not yet been programmed and are in the erase (ER) state, so the corresponding channel is also turned on. Therefore, the precharge voltage VPRE applied from the common source line CSL only reaches the channel at a position corresponding to each word line below the selected word line 112A.

In addition, because the precharge off voltage Vpre_off is applied to the middle dummy word line group (MDWL) 114, the corresponding channel is not turned on, and the precharge voltage VPRE cannot reach there. Accordingly, the top-deck word line 110A adjacent to the middle dummy word line group (MDWL) 114 does not cause disturbance to the programmed state of the top-deck word line 110A due to the down-coupling effect. Therefore, disturbance to the word line 110A adjacent to the middle dummy word line group 114 can be prevented.

Similarly, as shown in FIG. 5B, after the precharge stage is completed, the programming stage starts. At this time, the programming voltage VPGM is applied to the selected bottom-deck word line 112A to perform programming, and the pass voltage VPASSP is applied to the unselected word lines (including the programmed word lines in the top-deck word line group 110 and the unprogrammed word lines in the bottom-deck word line group 112). In addition, the pass voltage VPASSP is also applied to the middle dummy word line group (MDWL) 114 and even the bottom dummy word line group (BDWL) 116. The pass voltage VPASSP can keep the word line in an unselected state.

Figure 6:
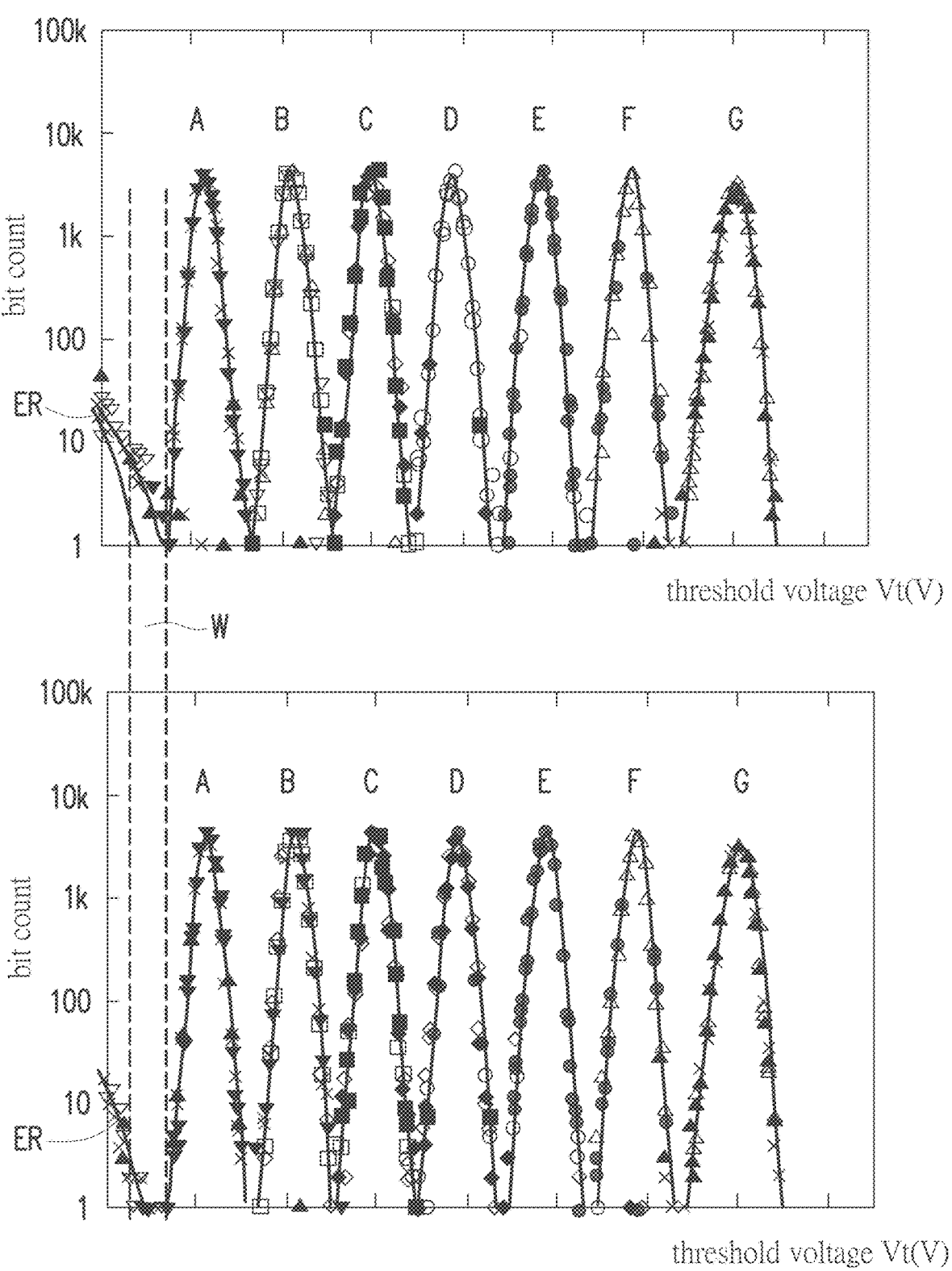
FIG. 6 is a comparison chart between experiment results of the precharging method in the related art and the precharging method in an embodiment of the disclosure.

FIG. 6 is a comparison chart between experiment results of the precharging method in the related art and the precharging method in an embodiment of the disclosure. In FIG. 6, the vertical axis represents the bit count, and the horizontal axis represents the threshold voltage Vt. In addition, FIG. 6 indicates the erase state (ER) and the programming state (A to G) of the memory cells on each word line. The upper part of FIG. 6 shows the experiment result obtained using the precharging method in the related art, and the lower part of FIG. 6 shows the experiment result obtained using the precharging method in the embodiment of the disclosure.

As can be seen from the upper part of FIG. 6, when programming the bottom-deck word line in the double-deck stacked structure, since the middle dummy word line is still turned on during the precharge stage, the precharge voltage causes disturbance to the programmed top-deck word line adjacent to the middle dummy word line. As a result, the erase state ER and the programming state A are too close, and the read boundaries therebetween may overlap, causing erroneous reading.

It can be seen from the lower part of FIG. 6 that, in the case of using the precharging method of the embodiment of the disclosure, in the precharge stage, the precharge on voltage Vpre_on is applied to the middle dummy word line 114 to turn on the channel and precharge the channel only when programming the top-deck word line 110. However, when programming the bottom-deck word line 110, the precharge off voltage Vpre_off is applied to the middle dummy word line 114 to turn off the channel so as not to precharge the channel. Therefore, in this case, there is no redundant precharge that causes disturbance to the pro-grammed top-deck word lines adjacent to the middle dummy word line.

Figure 7:
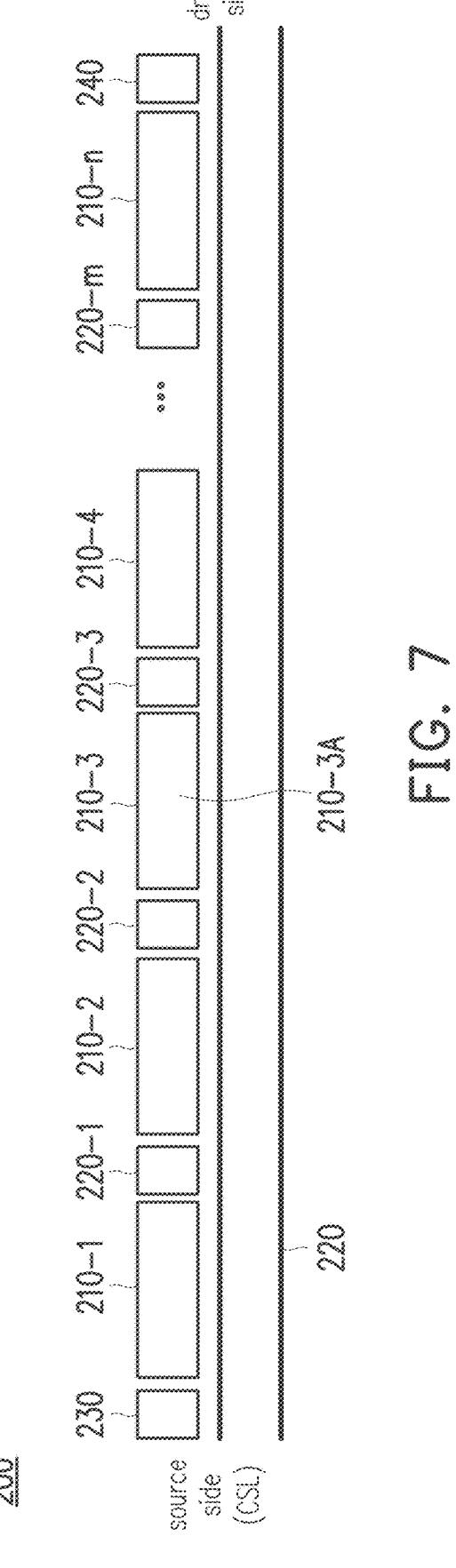
FIG. 7 is a schematic diagram illustrating a modification of the precharging method of the disclosure.

FIG. 7 is a schematic diagram illustrating a modification of the precharging method of the disclosure. In this example, a 3D memory device 200 includes multiple decks of word line groups 210-1, 210-2, . . . , 210-n (n groups). In addition, a plurality of middle dummy word line groups 220-1, 220-2, . . . , 220-m (m groups) are respectively arranged between every two decks of word line groups of the multiple decks of word line groups 210-1, 210-2, . . . , 210-n. For example, the middle dummy word line group 220-2 is provided between a deck of word line group 210-2 and a deck of word line group 210-3. Further, a bottom dummy word line group 230 is provided below the lowermost deck of word line group 210-1 of the multiple decks of word line groups 210-1, 210-2, . . . , 210-n. Moreover, in an embodi-ment, a top dummy word line group 240 is provided above the uppermost deck of word line group 210-n of the multiple decks of word line groups 210-1, 210-2, . . . , 210-n. Similarly, other components of the 3D memory device 200 that are not shown here may be inferred from existing structures developed for the future, and thus detailed description will be omitted.

In this example, the vertical stacked structure is described in a horizontal manner. In other words, the word line group 210-n is located in the uppermost deck of the entire stacked structure, and the word line group 210-1 is located in the lowermost deck of the entire stacked structure. Each deck of the multiple decks of word line groups 210-1, 210-2, . . . , 210-n may further include a plurality of word lines. Each of the middle dummy word line groups 220-1, 220-2, . . . , 220-m may further include a plurality of middle dummy word lines. The bottom dummy word line group 230 may include a plurality of bottom dummy word lines. The top dummy word line group 240 may include a plurality of top dummy word lines.

In addition, in this embodiment, the voltage waveforms used in the precharge stage and the programming stage may be understood by referring to the examples of FIG. 5A and FIG. 5B. Same as the above embodiment, before program-ming, the precharge voltage VPRE is applied from the common source line CSL to precharge the channel 220. First, a word line is selected from the multiple decks of word line groups 210-1, 210-2, . . . , 210-n for programming. For example, word lines are sequentially (from top to bottom) selected from the multiple decks of word line groups 210-n, 210-(n−1), . . . , 210-2, and 210-1, and the word line 210-3A is selected. Next, it is determined in which of the multiple decks of word line groups 210-n, 210-(n−1), . . . , 210-2, and 210-1 the selected word line 210-3A is located in. In this example, the selected word line 210-3A is in the word line group 210-3.

Then, the precharge on voltage Vpre_on is applied to each of the middle dummy word line groups 220-2 and 220-1 and the bottom dummy word line 230 below the deck of word line group 210-3, so that the precharge voltage VPRE reaches the channel at a position corresponding to each of the middle dummy word line groups 220-2 and 220-1 below the deck of word line group 210-3. Thereby, the precharge capability of the word line group 210-3 can be maintained. Further, the precharge off voltage Vpre_off is applied to each of the middle dummy word line groups 220-3, . . . , 220-m above the deck of word line group 210-3 to turn off the channel. Therefore, the precharge voltage VPRE does not reach the channel at a position corresponding to each of the middle dummy word line groups 220-3, . . . , 220-m above the word line group 210-3. Therefore, disturbance to the word lines adjacent to the middle dummy word line groups 220-3, . . . , 220-m can be avoided.

Although the above embodiment illustrates a 3D NAND flash memory device as an example, the disclosure is not limited to NAND flash memory devices and can also be applied to other types of memories such as a 3D NOR flash memory device.

In addition, the memory cells constituting the memory device that uses the precharging method of the disclosure may be single-level cells (SLC) that store 1 bit, multiple-level cells (MLC) that store 2 bits, triple-level cells (TLC) that store 3 bits, or quad-level cells (QLC) that store 4 bits.

In summary, based on the embodiments of the disclosure, in a 3D memory device with a structure that has multiple decks of word line groups, the middle dummy word line layer is appropriately controlled to be turned on or off in the precharge stage based on the position of the word line selected to be programmed, so as to control the precharging operation. Thus, the precharge capability of the top-deck word lines can be maintained and disturbance to the word lines adjacent to the middle dummy word lines can be prevented.

What is claimed is:

1. A precharging method for a 3D memory device, which at least comprises a top-deck word line group, a middle dummy word line group, a bottom-deck word line group, and a bottom dummy word line group arranged in sequence, the precharging method comprising:

selecting a word line sequentially from the top-deck word line group and the bottom-deck word line group to be programmed;

determining whether the word line selected is in the top-deck word line group or the bottom-deck word line group;

applying a precharge on voltage to the middle dummy word line group so that a precharge voltage reaches a channel at a position corresponding to the middle dummy word line group in response to the word line being in the top-deck word line group; and applying a precharge off voltage to the middle dummy word line group so that the precharge voltage does not reach the channel at the position corresponding to the middle dummy word line group in response to the word line being in the bottom-deck word line group, wherein the precharge on voltage is much smaller than a voltage for programming the word line selected, and the precharge off voltage is 0V.

2. The precharging method for the 3D memory device according to claim 1, wherein the 3D memory device further comprises a common source line, and the precharge voltage is applied from the common source line.

3. The precharging method for the 3D memory device according to claim 1, further comprising applying the precharge on voltage to the bottom dummy word line group when precharging.

4. The precharging method for the 3D memory device according to claim 1, wherein the 3D memory device comprises an array comprising a plurality of memory cells, and the plurality of memory cells are single-level cells, multiple-level cells, triple-level cells, or quad-level cells.

5. The precharging method for the 3D memory device according to claim 1, wherein the 3D memory device is a 3D NAND memory device.

6. A precharging method for a 3D memory device, which at least comprises multiple decks of word line groups, a plurality of middle dummy word line groups, and a bottom dummy word line group, wherein the bottom dummy word line group is located below a lowermost deck of word line group of the multiple decks of word line groups, and each of the plurality of middle dummy word line groups is arranged between every two decks of word line groups of the multiple decks of word line groups, the precharging method comprising:

selecting a word line sequentially from the multiple decks of word line groups to be programmed;

determining in which one deck of word line group of the multiple decks of word line groups the word line is located in;

applying a precharge on voltage to each middle dummy word line group below the one deck of word line group so that a precharge voltage reaches a channel at a position corresponding to each middle dummy word line group below the one deck of word line group; and applying a precharge off voltage to each middle dummy word line group above the one deck of word line group so that the precharge voltage does not reach the channel at the position corresponding to each middle dummy word line group above the one deck of word line group, wherein the precharge on voltage is much smaller than a voltage for programming the word line selected, and the precharge off voltage is 0V.

7. The precharging method for the 3D memory device according to claim 6, wherein the 3D memory device further comprises a common source line, and the precharge voltage is applied from the common source line.

8. The precharging method for the 3D memory device according to claim 6, further comprising applying the precharge on voltage to the bottom dummy word line group when precharging.

9. The precharging method for the 3D memory device according to claim 6, wherein the 3D memory device comprises an array comprising a plurality of memory cells, and the plurality of memory cells are single-level cells, multiple-level cells, triple-level cells, or quad-level cells.

10. The precharging method for the 3D memory device according to claim 6, wherein the 3D memory device is a 3D NAND memory device.

11. A programming method for a 3D memory device, which at least comprises a top-deck word line group, a middle dummy word line group, a bottom-deck word line group, and a bottom dummy word line group arranged in sequence, the programming method comprising:

selecting a word line sequentially from the top-deck word line group and the bottom-deck word line group to be programmed;

determining whether the word line selected is in the top-deck word line group or the bottom-deck word line group;

applying a precharge on voltage to the middle dummy word line group so that a precharge voltage reaches a channel at a position corresponding to the middle dummy word line group in response to the word line being in the top-deck word line group;

applying a precharge off voltage to the middle dummy word line group so that the precharge voltage does not reach the channel at the position corresponding to the middle dummy word line group in response to the word line being in the bottom-deck word line group; and applying a programming voltage to the word line selected after completing applying the precharge voltage, wherein the precharge on voltage is much smaller than a voltage for programming the word line selected, and the precharge off voltage is 0V.

12. The programming method for the 3D memory device according to claim 11, wherein the 3D memory device further comprises a common source line, and the precharge voltage is applied from the common source line.

13. The programming method for the 3D memory device according to claim 11, further comprising applying the precharge on voltage to the bottom dummy word line group when precharging.

14. The programming method for the 3D memory device according to claim 11, wherein the 3D memory device comprises an array comprising a plurality of memory cells, and the plurality of memory cells are single-level cells, multiple-level cells, triple-level cells, or quad-level cells.

15. The programming method for the 3D memory device according to claim 11, wherein the 3D memory device is a 3D NAND memory device.

* * * * *